United States Patent
Tavakol et al.

(10) Patent No.: US 10,110,195 B2
(45) Date of Patent: Oct. 23, 2018

(54) CMOS TUNER AND RELATED TUNING ALGORITHM FOR A PASSIVE ADAPTIVE ANTENNA MATCHING NETWORK SUITABLE FOR USE WITH AGILE RF TRANSCEIVERS

(71) Applicants: Armin Tavakol, Den Bosch (NL); Robert Bogdan Staszewski, Dublin (IE)

(72) Inventors: Armin Tavakol, Den Bosch (NL); Robert Bogdan Staszewski, Dublin (IE)

(73) Assignee: Short Circuit Technologies LLC, Rochester, NY (US)

( * ) Notice: Subject to any disclaimer, the term of this patent is extended or adjusted under 35 U.S.C. 154(b) by 479 days.

(21) Appl. No.: 14/874,422

(22) Filed: Oct. 3, 2015

(65) Prior Publication Data

US 2016/0099700 A1  Apr. 7, 2016

Related U.S. Application Data

(60) Provisional application No. 62/059,448, filed on Oct. 3, 2014.

(51) Int. Cl.
*H03H 7/38* (2006.01)
*H01F 27/28* (2006.01)
(Continued)

(52) U.S. Cl.
CPC ........... *H03H 7/38* (2013.01); *H01F 27/2823* (2013.01); *H01F 27/29* (2013.01); *H01Q 1/50* (2013.01); *H03F 1/0205* (2013.01); *H03F 1/565* (2013.01); *H03F 3/193* (2013.01); *H03F 3/211* (2013.01); *H03F 3/2171* (2013.01); *H03F 3/2176* (2013.01); *H03F 3/245* (2013.01); *H03H 7/09* (2013.01); *H03H 7/40* (2013.01);
(Continued)

(58) Field of Classification Search
CPC combination set(s) only.
See application file for complete search history.

(56) References Cited

U.S. PATENT DOCUMENTS 4,346,341 A * 8/1982 Blackburn ............... H02J 3/12
   323/257
5,467,013 A * 11/1995 Williams .............. B24B 37/013
   257/E21.528

(Continued)

OTHER PUBLICATIONS de Mingo, J. et al.,"An RF Elect Cont Imped Tuning Net Design and Its Appl to an Ant Input Imped Autom Matching Sys",IEEE Trans Micro Thy&Tech,vol. 52,No. 2,pp. 489-497,Feb. 2004.
(Continued)

*Primary Examiner* — Junpeng Chen
(74) *Attorney, Agent, or Firm* — Zaretsky Group PC; Howard Zaretsky

(57) ABSTRACT

A novel and useful adaptive antenna tuner and associated calibration mechanism for passive adaptive antenna matching networks. The tuner is suitable for use with cellular antennas and in one embodiment uses MEMS based tunable devices. The tuner contains voltage and current sensors inserted before the antenna matching network. The sensed complex impedance generates one or more update control signals for the tuning algorithm which drives the MEMS-based tunable devices.

20 Claims, 10 Drawing Sheets

(51) Int. Cl.
*H03F 1/02* (2006.01)
*H03F 1/56* (2006.01)
*H03F 3/193* (2006.01)
*H03F 3/21* (2006.01)
*H03F 3/217* (2006.01)
*H01F 27/29* (2006.01)
*H01Q 1/50* (2006.01)
*H03H 7/40* (2006.01)
*H03F 3/24* (2006.01)
*H03H 7/09* (2006.01)
*H03H 7/48* (2006.01)
*H03H 7/42* (2006.01)

(52) U.S. Cl.
CPC .............. *H03H 7/425* (2013.01); *H03H 7/48* (2013.01); *H03F 2200/318* (2013.01); *H03F 2200/451* (2013.01); *H03F 2200/534* (2013.01); *H03F 2200/537* (2013.01); *H03F 2200/541* (2013.01); *H03F 2203/21106* (2013.01); *H03F 2203/21139* (2013.01); *H03H 7/427* (2013.01)

(56) References Cited

U.S. PATENT DOCUMENTS

2006/0181351 A1\* 8/2006 Ripley ................. H03F 1/0216
  330/285
2013/0169359 A1\* 7/2013 Coumou ................. H03F 3/191
  330/192
2014/0220913 A1\* 8/2014 Coumou ................. H03H 7/40
  455/114.3

OTHER PUBLICATIONS

Meng, F. et al., "A Mismatch Detector for Adaptive Antenna Impedance Matching", 36th European Microwave Conf, pp. 1457-1460, 2006.

Firrao, E.L. et al., "An Automatic Antenna Tuning System Using Only RF Signal Amplitudes", IEEE Trans. Circ. and Syst., vol. 55, No. 9, pp. 833-837, Sep. 2008.

van Bezooijen, A. et al., "A GSM/EDGE/WCDMA Adaptive Series-Lc Matching Network Using RF-MEMS Switches", IEEE JSSC, vol. 43, No. 10, pp. 2259-2268, Oct. 2008.

Lo'pez-Delgadillo, E. et al., "Automatic Impedance Control for Chip-to-Chip Interconnections", IEEE ICECS 2008, pp. 332-335, 2008.

Song, H. et al., "A CMOS Adaptive Antenna-Impedance-Tuning IC Operating in the 850MHz-to-2GHz Band", IEEE ISSCC 2009, pp. 384-385, 2009.

van Bezooijen, A. et al., "Adaptive Impedance-Matching Techniques for Controlling L Networks", IEEE Trans. Circ. and Syst., vol. 57, No. 2, pp. 495-505, Feb. 2010.

Rumberg, B. et al., "A Low-Power Magnitude Detector for Analysis of Transient-Rich Signals", IEEE JSSC, vol. 47, No. 3, pp. 676-685, Mar. 2012.

\* cited by examiner

CMOS TUNER AND RELATED TUNING ALGORITHM FOR A PASSIVE ADAPTIVE ANTENNA MATCHING NETWORK SUITABLE FOR USE WITH AGILE RF TRANSCEIVERS

REFERENCE TO PRIORITY APPLICATION

This application claims priority to U.S. Provisional Application Ser. No. 62/059,448, filed Oct. 3, 2014, entitled "Power Amplifier," incorporated herein by reference in its entirety.

FIELD OF THE INVENTION

The present invention relates generally to tuning circuits and in particular to a CMOS based tuner and related tuning algorithm for a passive adaptive antenna matching network.

BACKGROUND OF THE INVENTION

The final active block in an RF transmitter chain is typically a power amplifier (PA), which functions to deliver a high-power output to an antenna. The antennas are typically designed to be 50Ω. This nominal value, however, can be greatly affected by environmental and frequency variations. Therefore, an adaptive matching network containing tunable components is typically placed between the power amplifier and the antenna in order to transform the antenna's impedance to that desired by the power amplifier for maximum power delivery.

SUMMARY OF THE INVENTION

The present invention is an adaptive antenna tuner and associated calibration mechanism for passive adaptive antenna matching networks. The tuner is suitable for use with cellular antennas and in one embodiment uses MEMS based tunable devices. The tuner contains voltage and current sensors inserted before the antenna matching network. The sensed complex impedance generates one or more update control signals for the tuning algorithm, which drives the MEMS-based tunable devices.

The tuner can be used to momentarily sense information about the input impedance and to control the tunable devices accordingly. In one embodiment, the presented matching network tuner contains three main units: (1) an off-chip unit which senses the current and voltage of the matching network input without a bulky sensing element or directional couple; (2) an impedance sensor chip which generates 2-bit data corresponding to the input impedance of the matching network; and (3) a tuning algorithm which tunes the tunable devices of the matching network based on inputs from the sensor chip.

Use of the adaptive antenna tuner of the present invention can greatly improve the input VSWR of the antenna matching network in mismatched conditions. The tuning algorithm allows this convergence in far fewer number of steps than prior art techniques. The dynamic operation of the system thus ensures maximum power transmission in any mismatched condition.

BRIEF DESCRIPTION OF THE DRAWINGS

The invention is herein described, by way of example only, with reference to the accompanying drawings, wherein.

DETAILED DESCRIPTION OF THE INVENTION

The present invention provides an adaptive antenna tuner and associated calibration mechanism for passive adaptive antenna matching networks. The tuner is suitable for use with cellular antennas and in one embodiment uses MEMS based tunable devices. The tuner can also work with IoT antennas while using MOS/MOM tunable devices. The tuner contains voltage and current sensors inserted before the antenna matching network. The sensed complex impedance generates one or more update control signals for the tuning algorithm, which drives the MEMS-based (or MOS/MOM based) tunable devices.

Adaptive antenna matching networks are now used in cellular transmitters. Use of adaptive antenna matching networks allows wideband operation with narrowband high-quality antennas of varying impedances. Tunable passive devices in the matching network can be calibrated for any specific mode of operation. Environmental changes, however, also affect the antenna's characteristics and can result in decreased maximum transmitted power and increased reflections. These changes are in nature unpredictable and increase the voltage standing wave ratio (VSWR). The present invention thus provides a dynamic tuning system that estimates this reflected power and attempts to minimize it.

In another embodiment, the impedance at the input of the matching network is measured. By using one or more sensing elements, multiple voltage signals are sampled (i.e. input voltage and current are sampled but the sensed signals are both voltage). Based on these, the real and imaginary parts of the impedance are evaluated. The sign of the imaginary part of the impedance and the comparative closeness to the center of the Smith chart when the impedance is pure resistive.

In another embodiment, a tuning algorithm relies on a LMS algorithm with a control loop. If the mismatch only affects the imaginary part of the antenna impedance, it is possible to use one or more tunable devices to bring the phase difference between the input current and voltage to zero thus forcing the impedance to the center of the Smith chart representing the antenna impedance. Any mismatch in the real part of the impedance, however, cannot be corrected using this embodiment.

Figure 1:
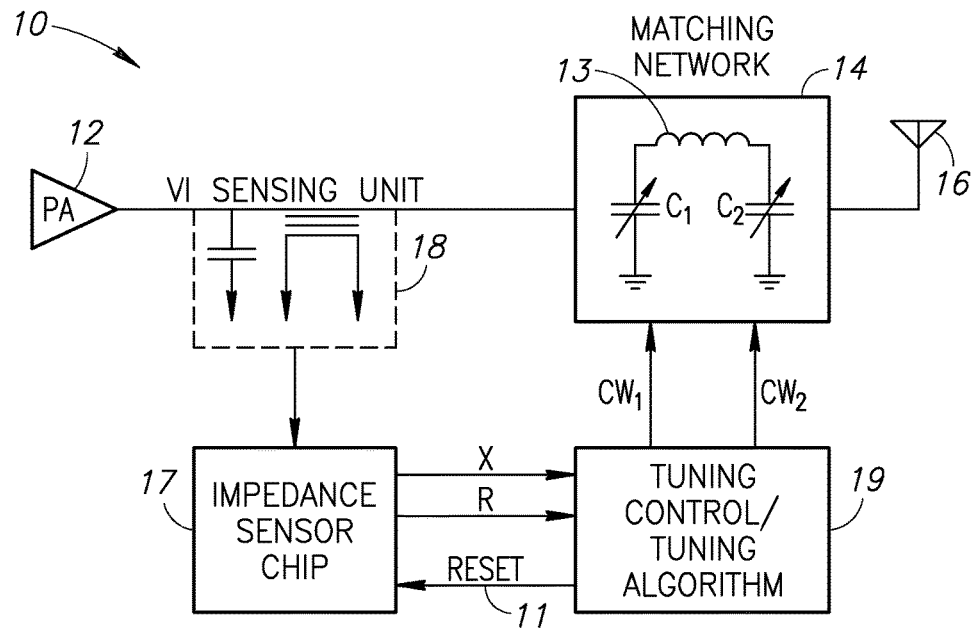
FIG. 1 is a high level block diagram illustrating an example embodiment of the antenna tuning system of the present invention.

A high level block diagram illustrating an example embodiment of the antenna tuning system of the present invention is shown in FIG. 1. The system, generally referenced 10, comprises a voltage/current (VI) sensing unit 18 for sensing voltage and current in the transmission line connecting the power amplifier 12 to the matching network 14 which is coupled to antenna 16. Sensed signals from the sensing unit 18 are input to impedance sensor integrated circuit (IC) or chip 17 which functions to generate imaginary X and real R signals (X and R are bits) for input to the tuning control circuit/tuning algorithm 19. The tuning algorithm 19 is operative to generate one or more control signals for configuring one or more corresponding tunable components in the antenna matching network 14. The tuning control signal circuit that implements the tuning algorithm and/or processes the output thereof is operative to generate a control signal indicating whether to add capacitance or inductance to a tunable component in the antenna matching network.

Note that in the example embodiment described herein, two signals X and R are provided to the tuning algorithm, which is operative to generate two control signals $CW_1$ and $CW_2$ for tuning tunable devices $C_1$ and $C_2$, respectively. It is appreciated by one skilled in the art, that the impedance sensor circuit 17 may generate any number M of signals and that any number M of control signals may be generated by the tuning algorithm for tuning corresponding M tunable components in the antenna matching network. Note that although there could be more than two tunable devices in the matching network, like M, the output of the chip in one embodiment is always two bits.

In another embodiment, an adaptive antenna tuner is provided that senses information about the input impedance in order to iteratively update the tunable devices in the antenna matching network. An impedance sensor provides enough information for the tuning algorithm based on a sign-sign LMS technique to be able to converge the input impedance to the center of the associated Smith chart. The control loop is shown in FIG. 1. It is appreciated by one skilled in the art, that the entire circuitry up to the antenna 16 could be implemented monolithically.

In one embodiment, the adaptive antenna tuner comprises three main units: (1) relatively simple off-chip passive circuitry 18 for sensing the current and voltage input of the input to the matching network input; (2) an impedance sensor circuit 17 (e.g., chip) which generates two bits of data corresponding to the input impedance of the matching network; and (3) a tuning algorithm 19 which functions to tune MEMS varactors within the matching network. Note that all three units may be implemented using hardware, software or a combination of hardware and software, depending on the particular implementation of the invention.

Voltage and Current Sensing

Figure 2:
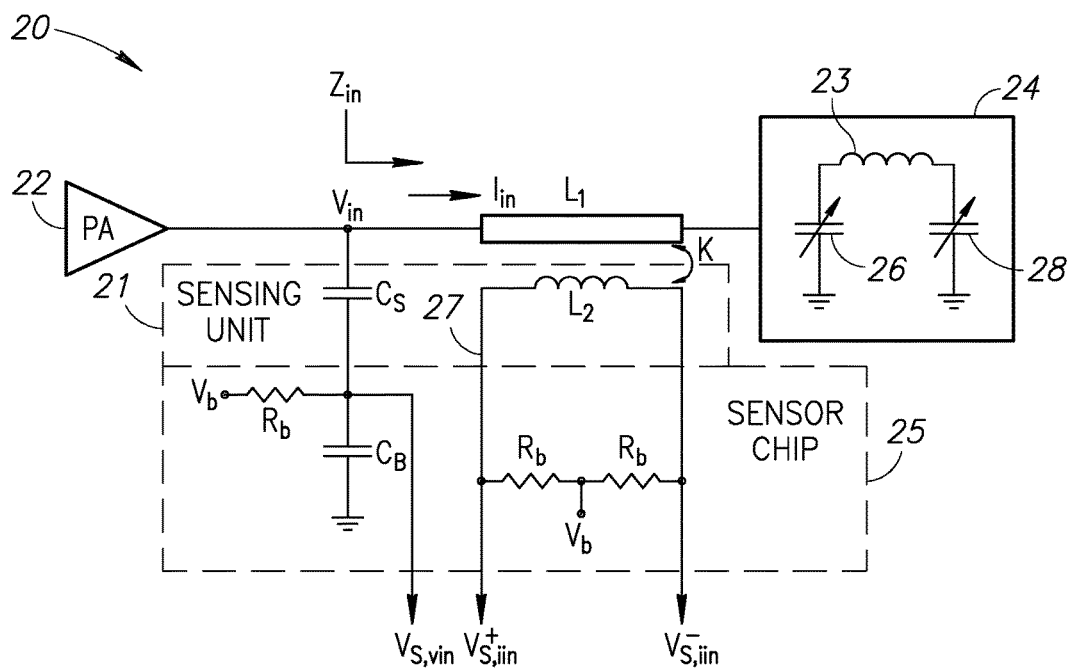
FIG. 2 is a high level schematic diagram illustrating the voltage/current (VI) sensing unit of the present invention.

To estimate the complex input impedance of the matching network on a Smith chart i.e. the output impedance as seen by the power amplifier, a sensing unit is used to sample its input voltage and current. A high level schematic diagram illustrating the VI sensing unit of the present invention is shown in FIG. 2. The sensing unit, generally referenced 20, comprises sensing unit circuit 21 coupled to sensor chip circuit 25 and to a transmission line connecting the power amplifier (PA) 22 to the matching network 24.

In one embodiment, the voltage sensing portion of the sensing unit comprises a capacitive divider represented by a relatively small capacitor $C_S$ and a relatively big capacitor $C_B$. Disregarding parallel parasitics, the sensed voltage denoted $V_{S,vin}$ has the same phase information as the input $v_{in}$ to the matching network. The amplitude of the sensed voltage is proportional to the input voltage by an attenuation factor as shown in Equation 1 below:

$$V_{S,vin} = K_{atten} \cdot v_{in} = \frac{C_s}{C_s + C_b} \cdot v_{in} \qquad (1)$$

where $C_s$ and $C_b$ are the small and big capacitors of the capacitive divider, respectively. In this example embodiment $C_s$ is off-chip but can be on-chip depending on the particular implementation. Capacitance $C_b$, however, is preferably implemented on-chip using any suitable capacitors such as metal insulator metal (MIM) or metal oxide metal (MOM) type capacitors. In an example embodiment, $C_s$=0.5 pF and $C_b$=7 pF are the small and big capacitor of the capacitive divider, respectively. Note that it can be shown that any series inductance between the capacitors only affects the denominator of $K_{atten}$ by adding a small real value. These parasitics, however, will not affect the phase of the $V_{S,vin}$ signal.

The current sensing portion of the sensor unit 21 is based on magnetic coupling between the transmission line (represented by $L_1$) connecting the output of the power amplifier 22 to the matching network 24. A narrow wire 27 is placed as close as possible to the transmission line in order to achieve maximum magnetic coupling k within the shortest length possible. As shown in FIG. 2, a small portion of the input current $i_{1n}$ flows through the sensing wire 27 by means of mutual inductance. The sensing wire has a finite inductance $L_2$ and is connected to a large resistive impedance $R_b$ placed on-chip for biasing purposes.

In one embodiment, $R_b$ is 5 kohms which is sufficient for a high impedance biasing path. $V_b$ is $V_{DD}/2$ which guarantees the proper operation of the following CMOS blocks. If the current through the sensing wire is disregarded, the differential voltage generated across the sensing wire can be calculated as in Equation 2 below:

$$V_{S,iin} = j\omega M \cdot i_{1n} \qquad (2)$$

where $M = K\sqrt{L_1 L_2}$. Inductances $L_1$ and $L_2$ correspond to the inductances of the coupled portion of the transmission line and the sensing wire, accordingly. Therefore, $V_{S,iin}$ contains both the phase and amplitude information of the input current.

In the example embodiment described herein, both sensing units are off-chip and implemented on a printed circuit board (PCB). Alternatively, both sensing units may be on-chip or one on-chip and one off-chip. It is noted that the mutual inductance of the sensing wire can potentially cause discontinuities in the characteristics of the transmission line which are preferably investigated. These discontinuities can be compensated for by using open stubs on the transmission line. The $C_s$ of the capacitive voltage divider also adds a small shunt capacitive load to the output load of the PA which is also considered and compensated for in the tuning algorithm, described in more detail infra.

Impedance Sensor Chip

In one embodiment, the off-chip sensing circuitry provides two signals for the impedance sensor chip: (1) $V_{S,vin}$ which corresponds to the input voltage of the matching network and (2) $V_{S,iin}$ which corresponds to the input current of the matching network. The phase and amplitude of these signals can be expressed by the phase and amplitude of $v_{in}$ and $i_{in}$ as in the following equations:

$$|V_{S,vin}| = \frac{C_s}{C_s + C_b} \cdot |v_{in}| \quad (3)$$

$$\text{angle}(V_{S,vin}) = \text{angle}(v_{in}) \quad (4)$$

$$|V_{S,iin}| = \omega \cdot M \cdot |i_{in}| \quad (5)$$

$$\angle(V_{S,iin}) = \angle(i_{in}) + 90° \quad (6)$$

In one embodiment, the sensor chip contains two independent paths, both providing one bit of information to the tuning algorithm. The first path (denoted the "X-path") contains a phase detector, which determines whether the $v_{in}$ phase leads or lags the $i_{in}$ phase. In other words, the phase difference between $V_{S,vin}$ and $V_{S,iin}$ ($\varphi_S = \angle(V_{S,vin}) - \angle(v_{S,iin})$) is recognized to be either less or more than 90 degrees.

The second path (denoted the "R-path") is only active when the impedance at the input of the matching network is real, i.e. is on the horizontal axis of the corresponding Smith chart. The R-path then determines whether the current real impedance at the input is closer to or further away from the center of the Smith chart as compared to the previous state (i.e. sensing event). These two paths are explained in more detail infra.

X-Path

Figure 3:
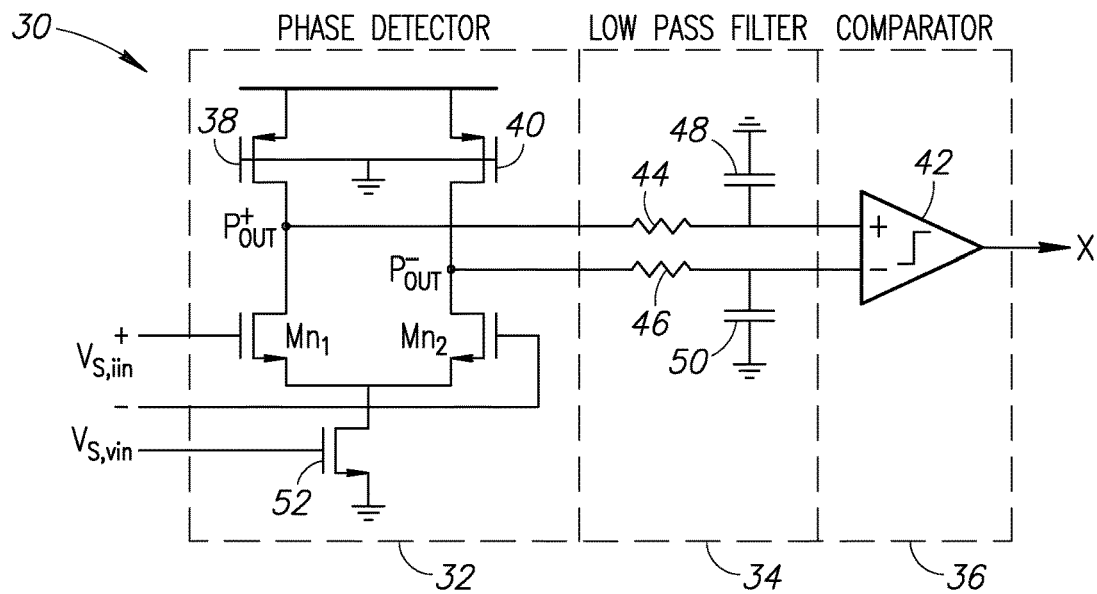
FIG. 3 is high level schematic diagram illustrating the X-path in more detail.
Figure 4:
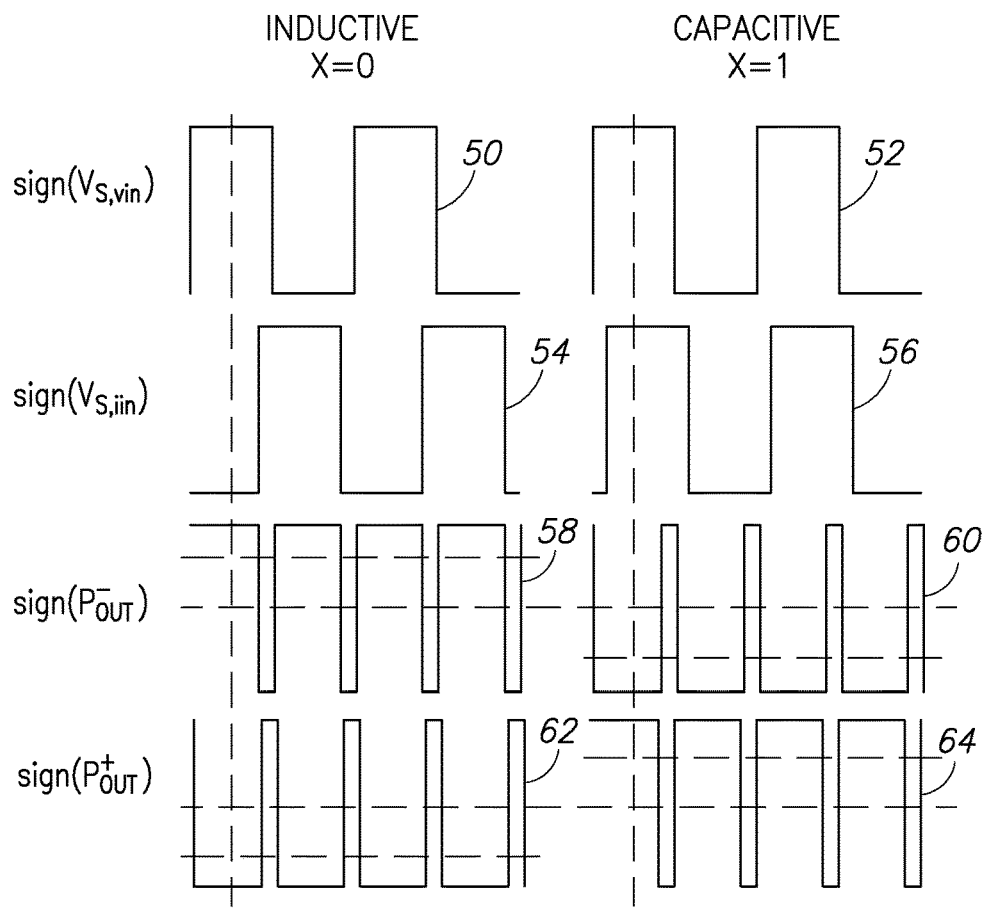
FIG. 4 is a diagram illustrating various waveforms of the timing mechanism and signs of the inputs and outputs of the phase detector and the low pass filter.

A high level schematic diagram illustrating the X-path in more detail is shown in FIG. 3. The X-path, generally referenced 30, comprises a phase detector 32, low pass filter 34 and comparator 36. The X-path 30 functions to detect the sign of the input impedance imaginary part. The phase detector 32 followed by a passive low pass filter (LPF) 34 and a comparator 36 function to determine whether φ is higher or lower than 90°. $P_{out}^+$ and $P_{out}^-$ are both biased at $V_{dd}$. During the positive half cycle of $V_{S,vin}$ when $Mn_1$ is on, $P_{out}^+$ and $P_{out}^-$ voltages are pulled down by $Mn_1$ and $Mn_2$, respectively, each for a period dependent on $\varphi_S$. FIG. 4 illustrates waveforms of the timing mechanism and signs of the inputs and outputs of the phase detector and the low pass filter.

The outputs of the low-pass filters indicate these periods and the comparator generates a 1-bit data signal indicating the comparison result between these two periods. The X-path output shows whether the input impedance is in the top-half or bottom-half of the corresponding Smith chart, i.e. either inductive or capacitive.

R-Path

The amplitude of the transmitted power at the input of the matching network can be written as shown below in Equation 7.

$$P_{in} = |v_{in}||i_{in}|\cos(\varphi_{in}) = |v_{in}||i_{in}|\sin(\varphi_S) \quad (7)$$

When the input impedance lies on horizontal axis of the Smith chart, $\varphi_S$ is 90° and $P_{in} = |v_{in}||i_{in}|$, i.e. the product of the input current and voltage amplitudes. As previously shown in Equations 3, 4, 5 and 6, the amplitudes of $V_{S,vin}$ and $V_{S,iin}$ are linearly related to the input current and voltage amplitude. Therefore, by maximizing the product of $|V_{S,vin}|$ and $|V_{S,iin}|$, the magnitude of the input power is also maximized. The maximum transmitted power corresponds to the impedance at the center of the Smith chart. Note that the approach described herein is only valid when dealing with real impedances.

Figure 5:
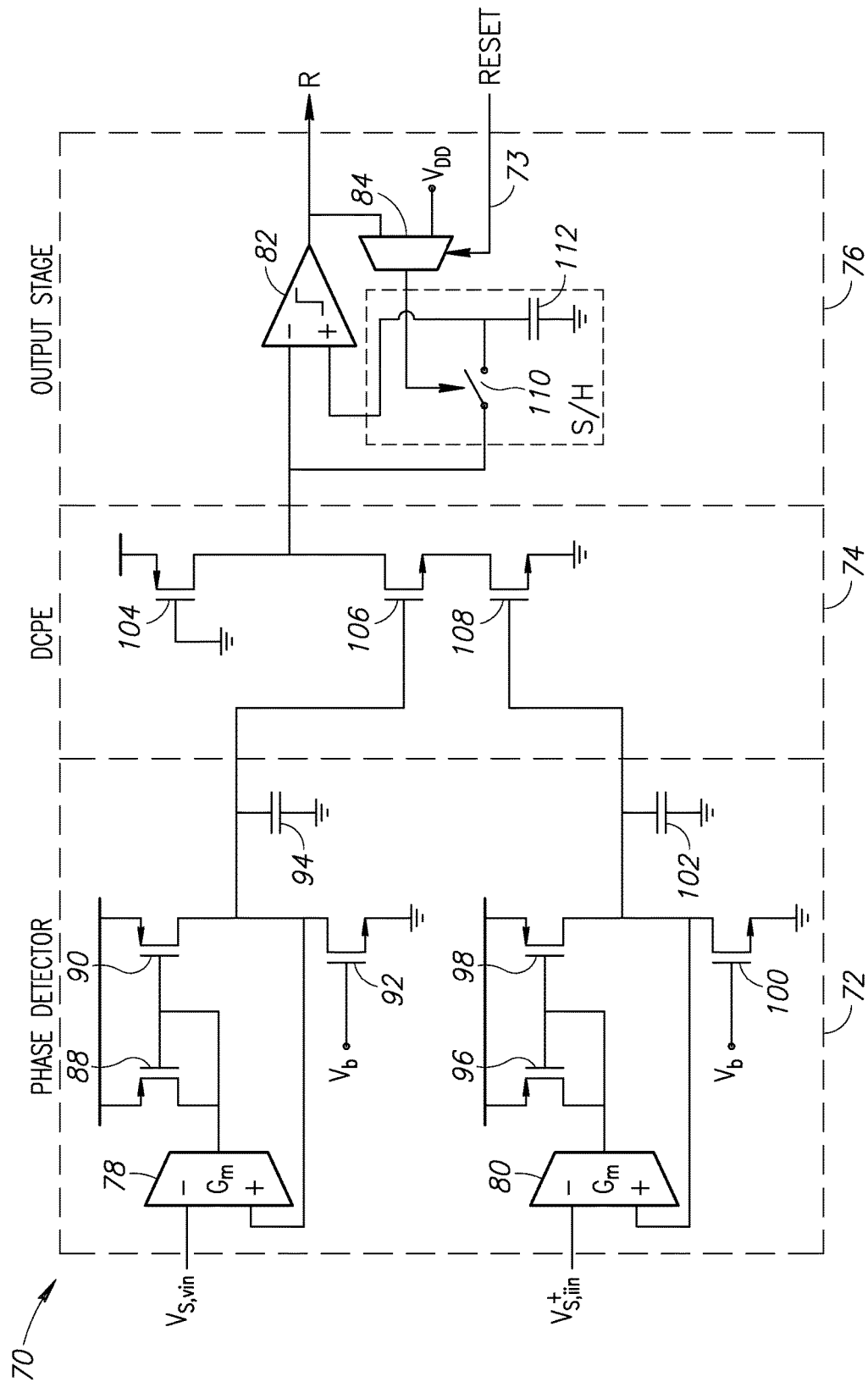
FIG. 5 is a high level schematic diagram illustrating the R-path.

A high level schematic diagram illustrating the R-path is shown in FIG. 5. The R-path, generally referenced 70, comprises peak detector 72, DC product estimator (DCPE) circuit 74 and output stage 76. The R-path starts with two linear peak detectors, the first comprising $G_m$ block 78, transistors 88, 90, 92 and capacitor 94, the second comprising $G_m$ block 80, transistors 96, 98, 100 and capacitor 102. The outputs of the peak detector are DC voltages corresponding to $|V_{S,vin}|$ and $|V_{S,iin}^+|$ ($|v_{in}|$ and $|i_{in}|$), respectively. These two DC signals are then fed to the DC product estimator (DCPE) which contains two cascoded NMOS transistors 106, 108 with a small PMOS transistor 104 with grounded gate as the load. The output of the DCPE has a minimum that occurs when the product of the inputs are a maximum. As described supra, this minimum corresponds to the impedance at the center of the Smith chart.

After the algorithm completes the X-path to place the input impedance onto the horizontal axis of the Smith chart, the output stage circuit 76 is then activated. The comparator 82 compares the value of the new DCPE output to the minimum value previously found and stored on the capacitor 112 in the sample-and-hold (S/H) circuit 86. A new value that is lower than the one stored on the capacitor 112 means that the new impedance on the horizontal axis of the Smith chart is closer to the center. Switch 110 closes and the new DC value is stored in the S/H capacitor 112. The R-path output informs the tuning algorithm that a new optimal point has been discovered. The tuning algorithm then determines a direction change (if any) communicated via one or more control signals, e.g., the two MEMS control words $CW_1$ and $CW_2$ (FIG. 1).

Tuning Algorithm

The tuning algorithm of the present invention will now be described in more detail. The outputs of the tuning algorithm are mostly dependent on the architecture of the matching network. The algorithm, however, employs the same approach for all matching networks. It is based on two steps performed repeatedly in succession to force the input impedance to converge to the center of the Smith chart. In general, the two steps are the following:
1. Bringing the imaginary part of the impedance to zero: This is accomplished by monitoring the X-path output and considering the imaginary part of the impedance to be as close as possible to zero when the output bit toggles. This means the sign of the imaginary part has changed and the input impedance lies as close as possible to the horizontal axis.
2. Finding the optimal point: After moving to the horizontal axis, the DCPE output indicates whether the new landing point is closer or further away from the previous landing point. This determines whether the direction the algorithm has chosen is correct or not. The output bit of the R-path provides the algorithm with this information and the algorithm determines the next state.

Figure 6:
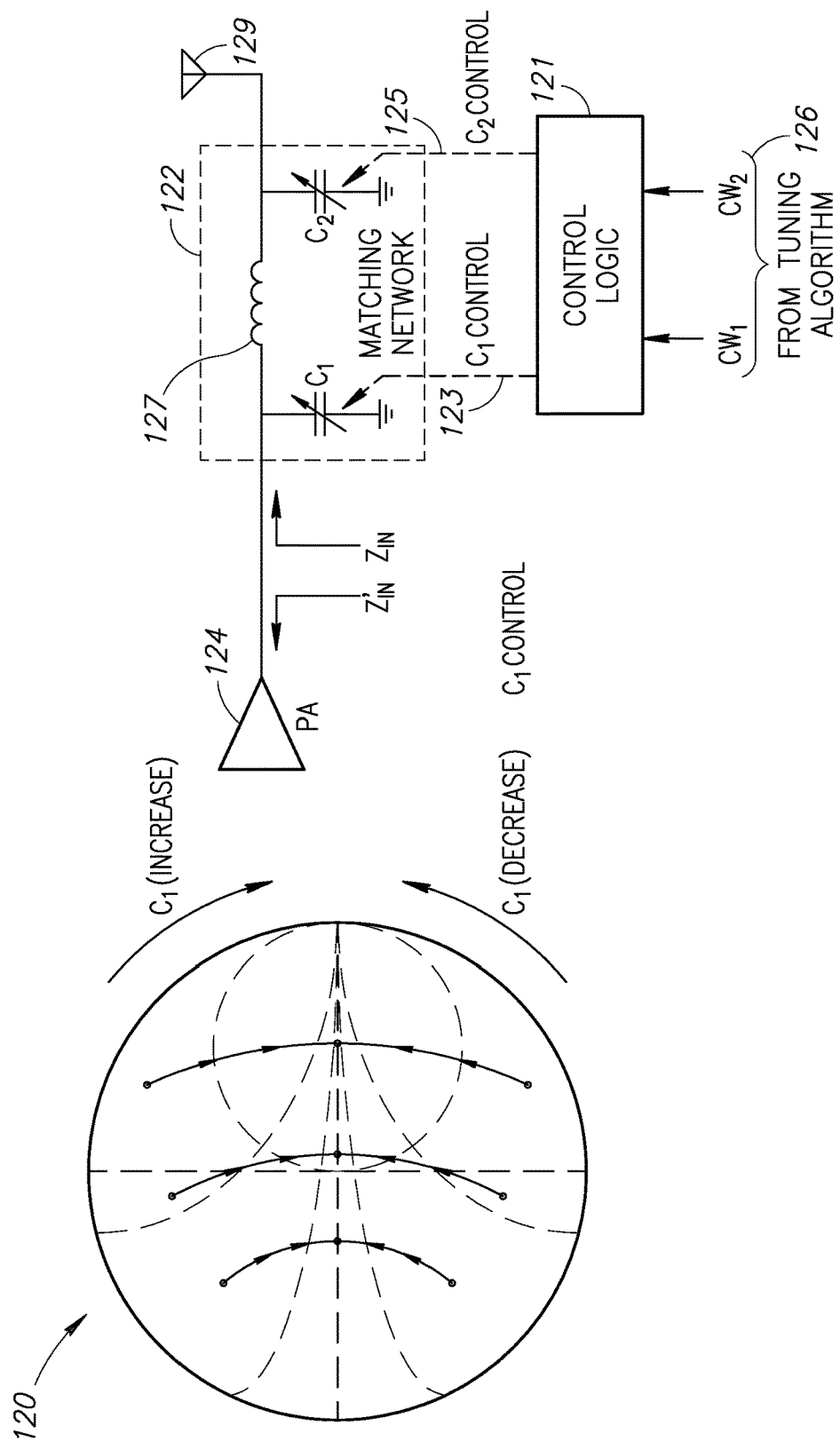
FIG. 6 is a diagram illustrating the effect of the shunt capacitors used in the tuning algorithm.

In the example embodiment described herein, the matching network 122 comprises a pi-shaped matching network including inductor 127 and two digitally controlled MEMS shunt capacitors $C_1$ and $C_2$, as shown in FIGS. 1 and 2 described supra. Note that the invention is not limited to the use of MEMS capacitors as any suitable configurable capacitor may be used. The effect of the shunt capacitors used in the tuning algorithm is shown in FIG. 6 by Smith chart 120. Control words $CW_1$ and $CW_2$ generated by the tuning algorithm are input to control logic 121 which functions to decode the control words and load any required registers for configuring the shunt capacitors. $C_1$ control 123 is generated for configuring capacitor $C_1$ and $C_2$ control 125 is generated for configuring capacitor $C_2$.

As indicated in FIG. 6, the first step of the algorithm is performed mostly via controlling $C_1$. The algorithm is operative such that if the tuning range of $C_1$ is unable to move the impedance to the horizontal axis of the Smith chart, the algorithm uses $C_2$ to push the input impedance to another location on the Smith chart where $C_1$ is able to toggle the output of the X-path by either decreasing or increasing its control word.

For the second step in the tuning algorithm, $C_2$ is used to adjust the location of the impedance on the horizontal axis. The $C_2$ capacitive step during the second tuning phase is set to be different from the first phase in order to prevent possible locking in an undesirable state.

A reset signal 11 (FIG. 1), 73 (FIG. 5) is used to reset the S/H circuit and to restart the algorithm. This is preferable in a dynamic operation since the previous optimal value stored in the S/H circuit can potentially prevent the R-path from discovering a new optimal point. This would result in confusion in the tuning algorithm in determining the direction in which $C_2$ should be increased or decreased. In one embodiment, the reset signal is used to reset the algorithm every hundreds of clock cycles to ensure correct dynamic tuning. In one embodiment, the clock frequency is 5 kHz and the reset signal is applied every 30 to 40 ms (i.e. every 150 to 200 cycles). Note that the reset signal only affects the S/H circuit. The control words of the capacitors retain their previous values.

Figure 7:
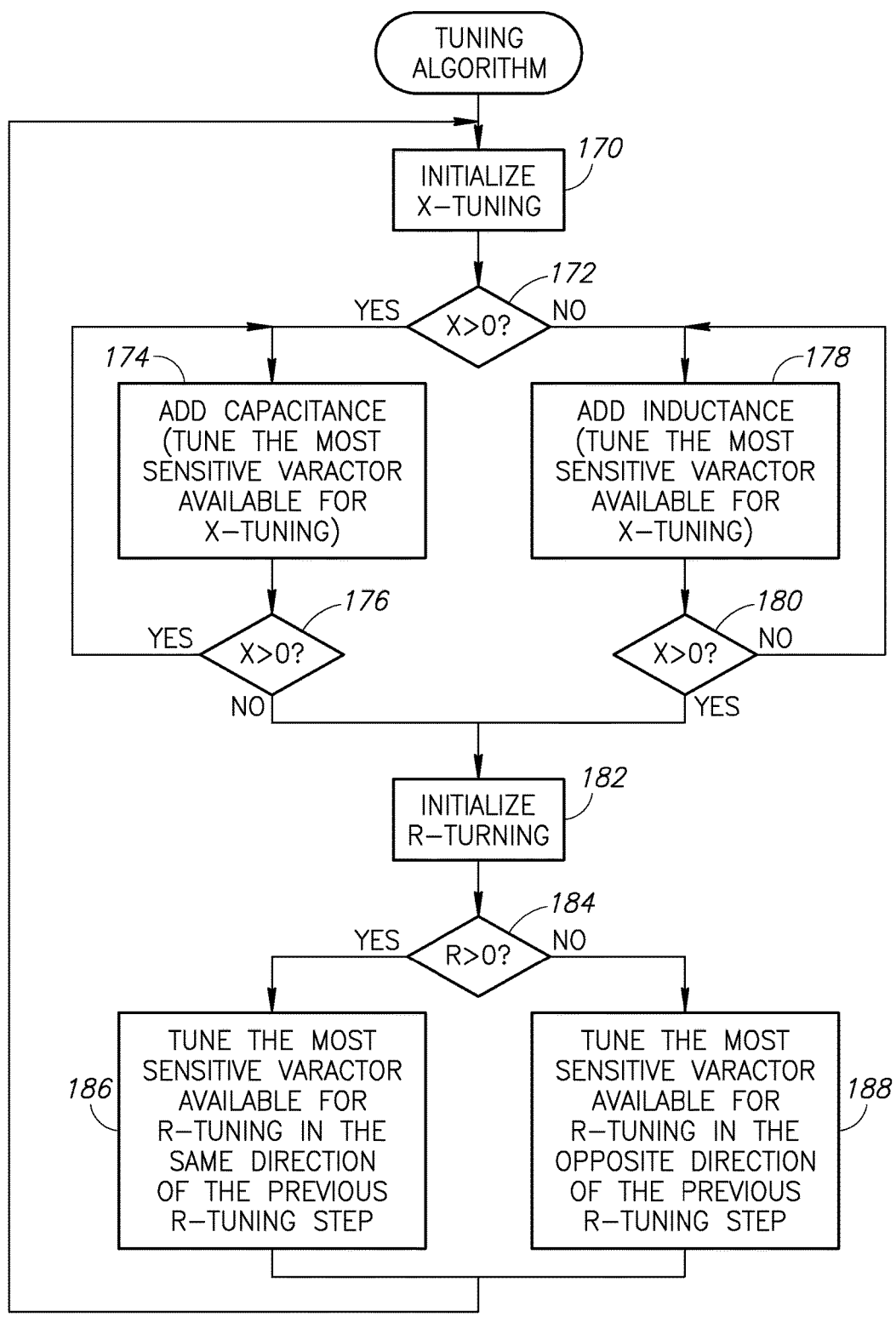
FIG. 7 is a flow diagram illustrating an example tuning algorithm of the present invention.

A flow diagram illustrating an example tuning algorithm of the present invention is shown in FIG. 7. First, the X-tuning is initialized (step 170). If X is greater than zero (step 172), then capacitance is added to the most sensitive tunable element (e.g., varactor) available for X-tuning (step 174). Step 174 is repeated until X is less then or equal to zero (step 176). The method then proceeds with R-tuning (step 182).

If X is not greater than zero (step 172), then inductance is added to the most sensitive tunable element (e.g., varactor) available for X-tuning (step 178). Step 178 is repeated until X is greater than zero (step 180). The method then proceeds with R-tuning (step 182).

Once R-tuning is initialized (step 182), if R is greater than zero (step 184), then the most sensitive tuning element available for R-tuning is configured in the same direction as the previous R-tuning step (step 186). Otherwise, the most sensitive tuning element available for R-tuning is configured in the opposite direction as the previous R-tuning step (step 188). The method then returns to the X-tuning step 170 to complete one step of the tuning loop.

Figure 8:
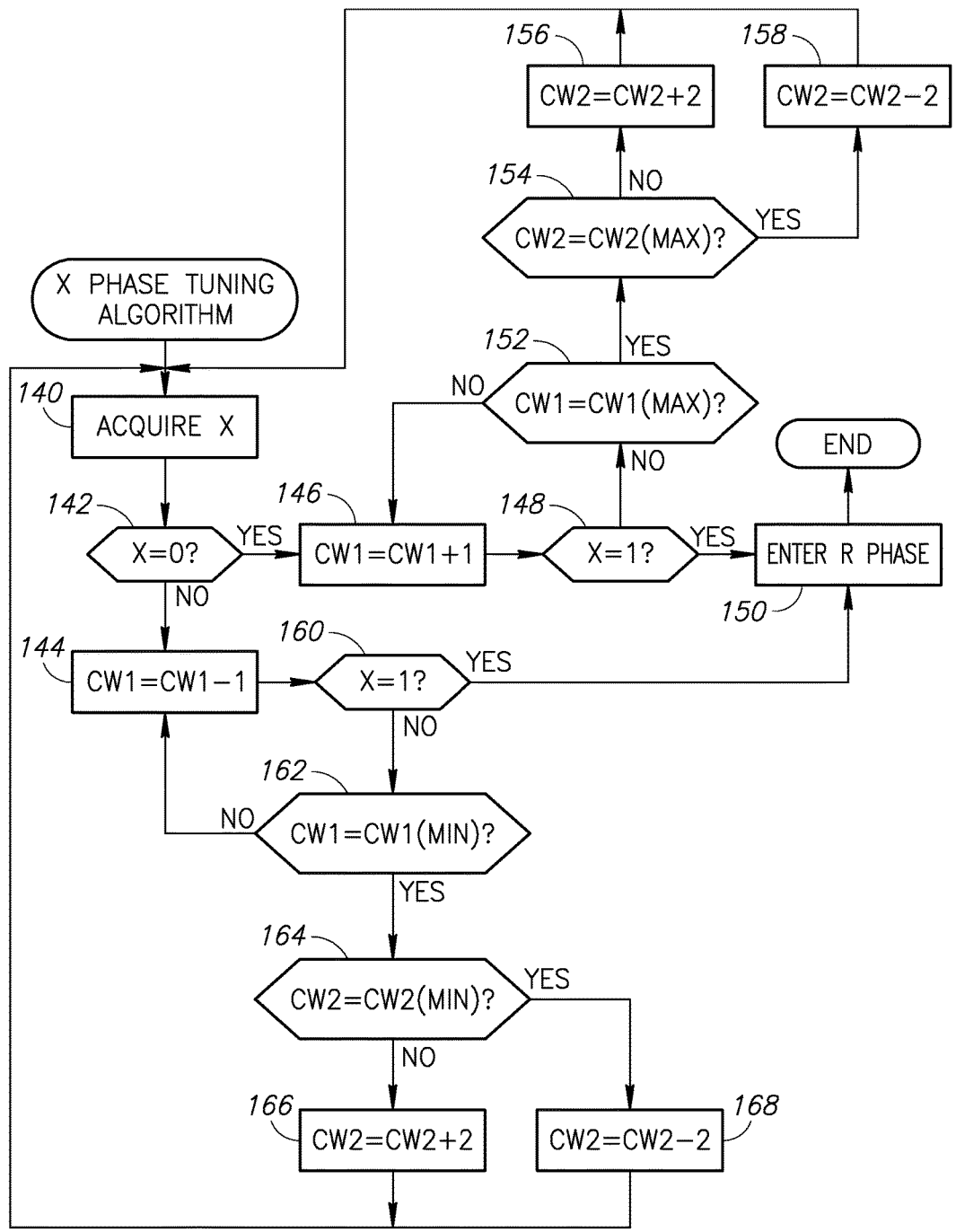
FIG. 8 is a flow diagram illustrating the X-phase tuning method in more detail.

A flow diagram illustrating the X-phase tuning method in more detail is shown in FIG. 8. First, an X value sample is acquired (step 140). If X is equal to zero (step 142), CW1 is incremented by one (step 146). If the new X sample is equal to one (step 148), the R phase is entered (step 150) and the method ends. If X does not equal one (step 148), it is checked whether CW1 is a maximum (step 152). If it is a maximum, then it is checked if CW2 is a maximum (step 154). If CW2 is a maximum, then CW2 is decremented by two (step 158), otherwise CW2 is incremented by two (step 156). If CW1 is not a maximum (step 152), then CW1 is incremented by one (step 146) and the method continues with step 148.

If X does not equal zero (step 142), then CW1 is decremented by one (step 144). It the new X sample is equal to 1 (step 160), then the R phase is entered (step 150). Otherwise, it is then checked whether CW1 is a minimum (step 162). If it not, the method continues with step 144. If CW1 is a minimum, then it is checked whether CW2 is a maximum (step 164). If it is, then CW2 is decremented by two (step 168). If CW2 is not a maximum, then CW2 is incremented by two (step 166). In both cases, the method proceeds with acquiring a new X value (step 140).

Example Implementation

An implementation of the sensor chip was fabricated by the inventors in 0.18 um CMOS. An FR4 PCB was used that included a 50-Ω microstrip line with electrical length of 180° placed between two SMA connectors. One connector was connected to an external power amplifier and the other was connected to a passive slug tuner terminated with 50Ω. The pi-matching network was placed in between the transmission line for de-embedding purposes. An RF power of 30 dBm was fed to the transmission line. The tuning algorithm was implemented on an Xilinx FPGA. The current sensing wire was placed as close as possible to the transmission line in order to achieve maximum magnetic coupling. Since the ground plane of the PCB was connected to the ground of the chip and also due to the high-impedance path seen by $V_{S,iin}$, both $V_{S,iin}^+$ and $V_{S,iin}^-$ voltages are dominated by electrical coupling instead of magnetic coupling. To solve this problem, the middle point of the sensing wire was biased by a low impedance path. This ensured that proper signals were delivered to the chip. The simulated value for the coupling coefficient was 0.22.

Figure 9:
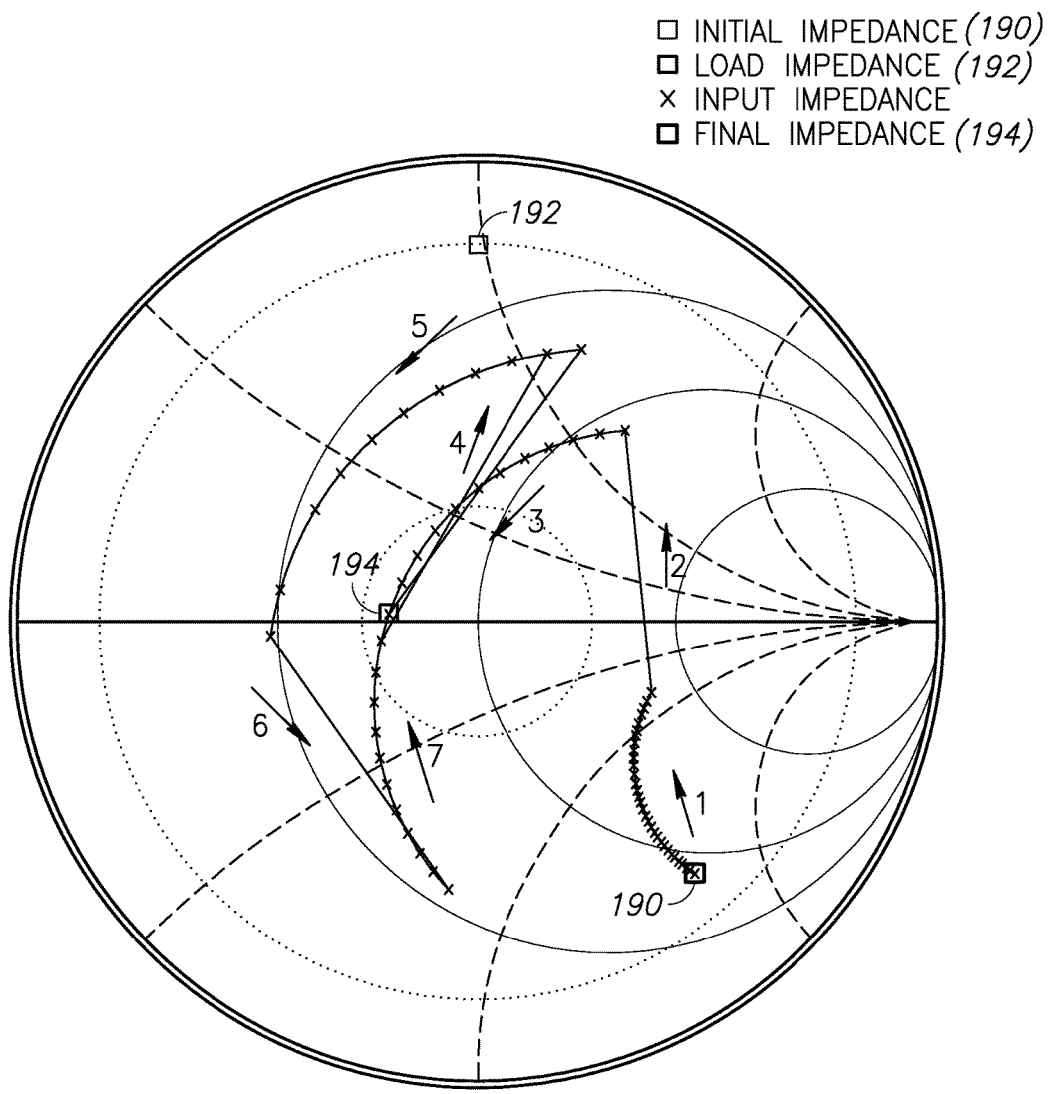
FIG. 9 is an example of the tuning achieved using the tuning algorithm of the present invention.
Figure 10:
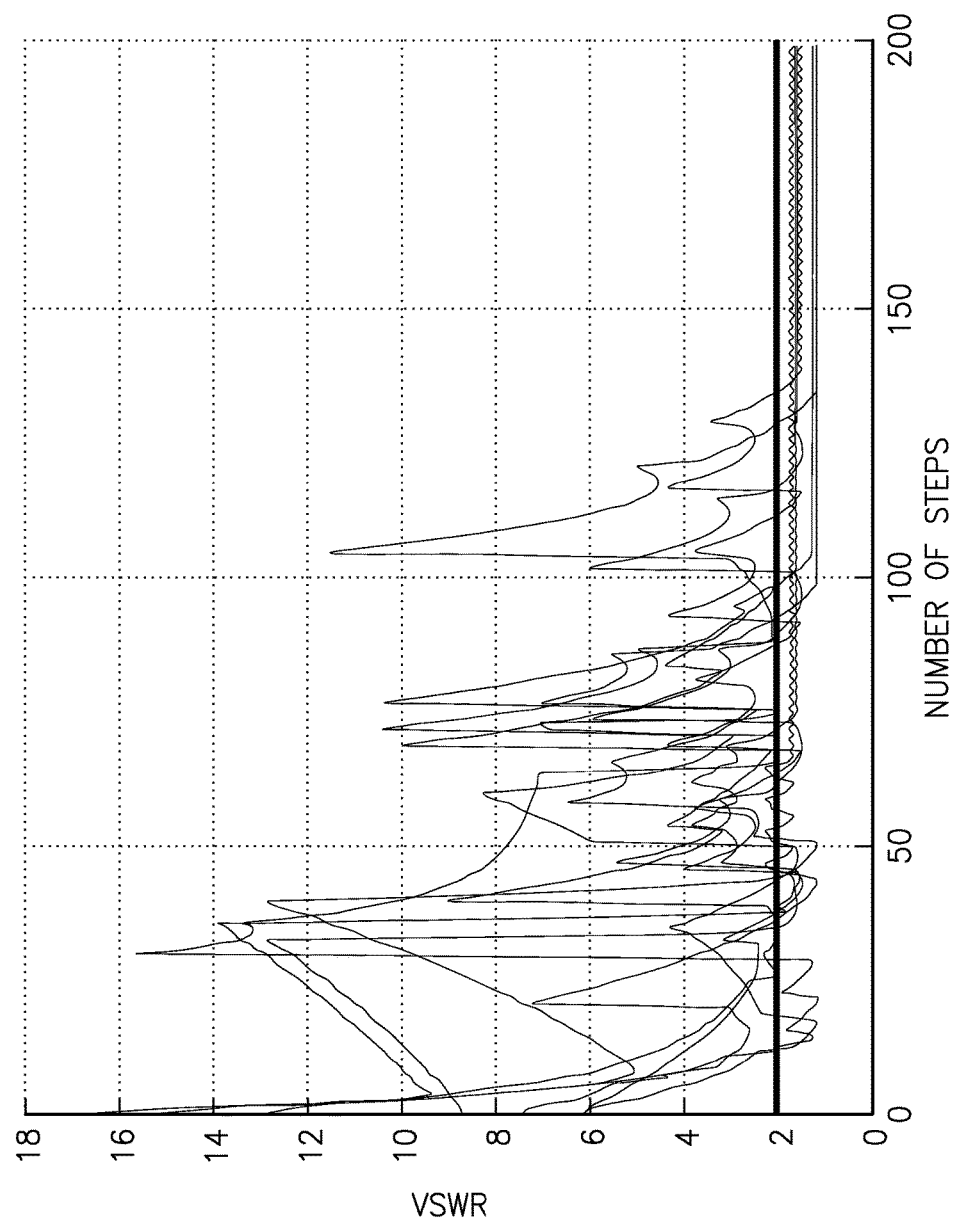
FIG. 10 is a diagram illustrating the dramatic reduction in VSWR to the target area as the tuning algorithm converges.

An example of the tuning achieved using the tuning algorithm of the present invention is shown in FIG. 9 where the convergence to the center of the Smith chart is illustrated. The initial impedance is indicated by square 190, the load impedance indicated by square 192, the final impedance indicated by square 194 and the various input impedances as the algorithm executes is indicated by the 'X's. Note that the target for the convergence of the algorithm is a VSWR of less than two. In order to test the tuning algorithm, the load impedance was placed on different locations on the VSWR=10 circle and then the algorithm was applied to the system. FIG. 10 illustrates the dramatic reduction in VSWR to the target area as the algorithm converges.

From FIG. 10 it can be seen that the input VSWR quickly reaches the target area. The algorithm then tries to find an even better location on the Smith chart with lower VSWR. It fails, however, in every direction and the VSWR increases again several times. Finally, it returns to the optimum point found and enters a rest mode until the reset signal is activated again and the search is then restarted.

Note that in the example described herein, the frequency of steps is 5 kHz. This is to ensure that the new command (i.e. $CW_1$ and $CW_2$) have has been received by the MEMS devices at each iteration step and the new value of the capacitor $C_1$ and/or $C_2$ has settled.

Mobile Device Incorporating the Antenna Tuner

Figure 11:
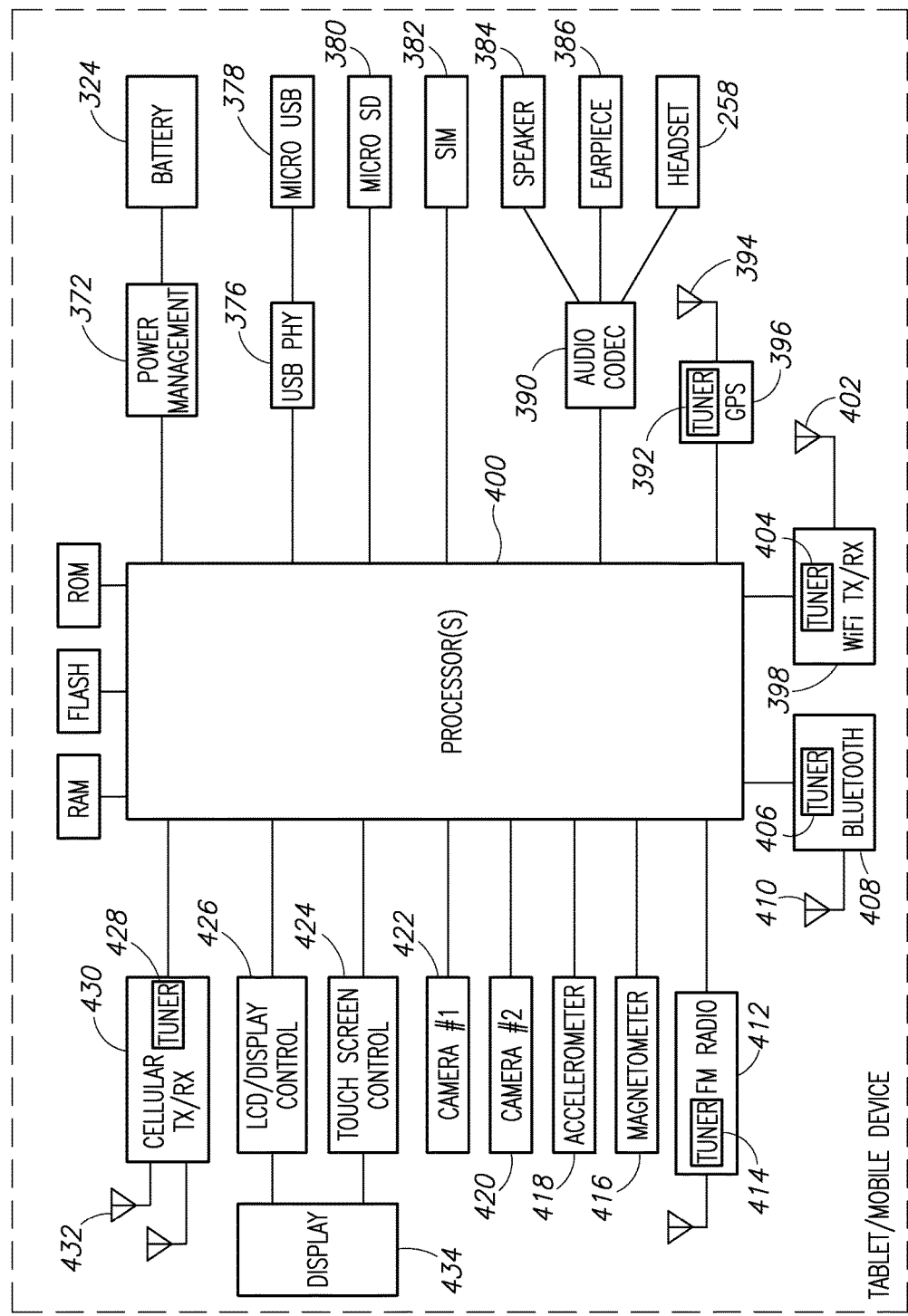
FIG. 11 is a block diagram illustrating an example mobile device incorporating the adaptive antenna tuner system of the present invention.

A block diagram illustrating an example tablet/mobile device incorporating a frequency generator that includes the adaptive antenna tuner of the present invention is shown in FIG. 11. The mobile device is preferably a two-way communication device having voice and/or data communication capabilities. In addition, the device optionally has the capability to communicate with other computer systems via the Internet. Note that the mobile device may comprise any suitable wired or wireless device such as multimedia player, mobile communication device, digital still or video camera, cellular phone, smartphone, iPhone, PDA, PNA, Bluetooth device, tablet computing device such as the iPad or other iOS device, Android device, Surface, Nexus, Google Glass, etc. For illustration purposes only, the device is shown as a mobile device, such as a cellular based telephone, smartphone or superphone. Note that this example is not intended to limit the scope of the mechanism as the invention can be implemented in a wide variety of communication devices. It is further appreciated the mobile device shown is intentionally simplified to illustrate only certain components, as the mobile device may comprise other components and subsystems beyond those shown.

The mobile device, generally referenced 370, comprises one or more processors 400 which may comprise a baseband processor, CPU, microprocessor, DSP, etc., optionally having both analog and digital portions. The mobile device may comprise a plurality of cellular radios 430 and associated antennas 432. Radios for the basic cellular link and any number of other wireless standards and Radio Access Technologies (RATs) may be included. Examples include, but are not limited to, Third Generation (3G) Long Term Evolution (LTE), Code Division Multiple Access (CDMA), Personal Communication Services (PCS), Global System for Mobile Communication (GSM)/GPRS/EDGE 3G; WCDMA; WiMAX for providing WiMAX wireless connectivity when within the range of a WiMAX wireless network; Bluetooth for providing Bluetooth wireless connectivity when within the range of a Bluetooth wireless network; WLAN for providing wireless connectivity when in a hot spot or within the range of an ad hoc, infrastructure or mesh based wireless LAN (WLAN) network; near field communications; UWB; GPS receiver for receiving GPS radio signals transmitted from one or more orbiting GPS satellites, FM transceiver provides the user the ability to listen to FM broadcasts as well as the ability to transmit audio over an unused FM station at low power, such as for playback over a car or home stereo system having an FM receiver, digital broadcast television, etc.

The mobile device may also comprise internal volatile storage 436 (e.g., RAM) and persistent storage 440 (e.g., ROM) and flash memory 438. Persistent storage 436 also stores applications executable by processor(s) 400 including the related data files used by those applications to allow device 370 to perform its intended functions. Several optional user-interface devices include trackball/thumbwheel which may comprise a depressible thumbwheel/trackball that is used for navigation, selection of menu choices and confirmation of action, keypad/keyboard such as arranged in QWERTY fashion for entering alphanumeric data and a numeric keypad for entering dialing digits and for other controls and inputs (the keyboard may also contain symbol, function and command keys such as a phone send/end key, a menu key and an escape key), headset 388, earpiece 386 and/or speaker 384, microphone(s) and associated audio codec 390 or other multimedia codecs, vibrator for alerting a user, one or more cameras and related circuitry 420, 422, display(s) 434 and associated display controller 426 and touchscreen control 424. Serial ports include a micro USB port 378 and related USB PHY 376 and micro SD port 380. Other interface connections may include SPI, SDIO, PCI, USB, etc. for providing a serial link to a user's PC or other device. SIM/RUIM card 382 provides the interface to a user's SIM or RUIM card for storing user data such as address book entries, user identification, etc.

Portable power is provided by the battery 374 coupled to power management circuitry 372. External power is provided via USB power or an AC/DC adapter connected to the power management circuitry that is operative to manage the charging and discharging of the battery. In addition to a battery and AC/DC external power source, additional optional power sources each with its own power limitations, include: a speaker phone, DC/DC power source, and any bus powered power source (e.g., USB device in bus powered mode).

Operating system software executed by the processor 400 is preferably stored in persistent storage (i.e. ROM 440), or flash memory 438, but may be stored in other types of memory devices. In addition, system software, specific device applications, or parts thereof, may be temporarily loaded into volatile storage 436, such as random access memory (RAM). Communications signals received by the mobile device may also be stored in the RAM.

The processor 400, in addition to its operating system functions, enables execution of software applications on the device 370. A predetermined set of applications that control basic device operations, such as data and voice communications, may be installed during manufacture. Additional applications (or apps) may be downloaded from the Internet and installed in memory for execution on the processor. Alternatively, software may be downloaded via any other suitable protocol, such as SDIO, USB, network server, etc.

Other components of the mobile device include an accelerometer 418 for detecting motion and orientation of the device, gyroscope 417 for measuring or maintaining orientation, magnetometer 416 for detecting the earth's magnetic field, FM radio 412 and antenna 413, Bluetooth radio 408 and antenna 410, Wi-Fi radio 398 including antenna 402 and GPS 392 and antenna 394.

In accordance with the invention, the mobile device 370 comprises one or more tuner circuits, each incorporating the adaptive antenna tuner of the present invention. Numerous embodiments of the mobile device 370 may comprise an adaptive antenna tuner circuit 428 as described supra incorporated in the one or more cellular radios 430; as adaptive antenna tuner circuit 414 as described supra incorporated in the FM radio 412; an adaptive antenna tuner circuit 406 as described supra incorporated in the Bluetooth radio 408; an adaptive antenna tuner circuit 404 as described supra incorporated in the Wi-Fi radio 398; and an adaptive antenna tuner circuit 396 as described supra incorporated in the GPS radio 392.

Internet of Things (IoT) Node Incorporating the Antenna Tuner

The Internet of Things (IoT) is defined as the network of physical objects or "things" embedded with electronics, software, sensors and network connectivity, which enables these objects to collect and exchange data. The IoT allows objects to be sensed and controlled remotely across existing network infrastructure, creating opportunities for more direct integration between the physical world and computer-based systems, and resulting in improved efficiency, accuracy and economic benefit. Each thing is uniquely identifiable through its embedded computing system but is able to interoperate within the existing Internet infrastructure. Experts estimate that the IoT will consist of almost 50 billion objects by 2020.

Figure 12:
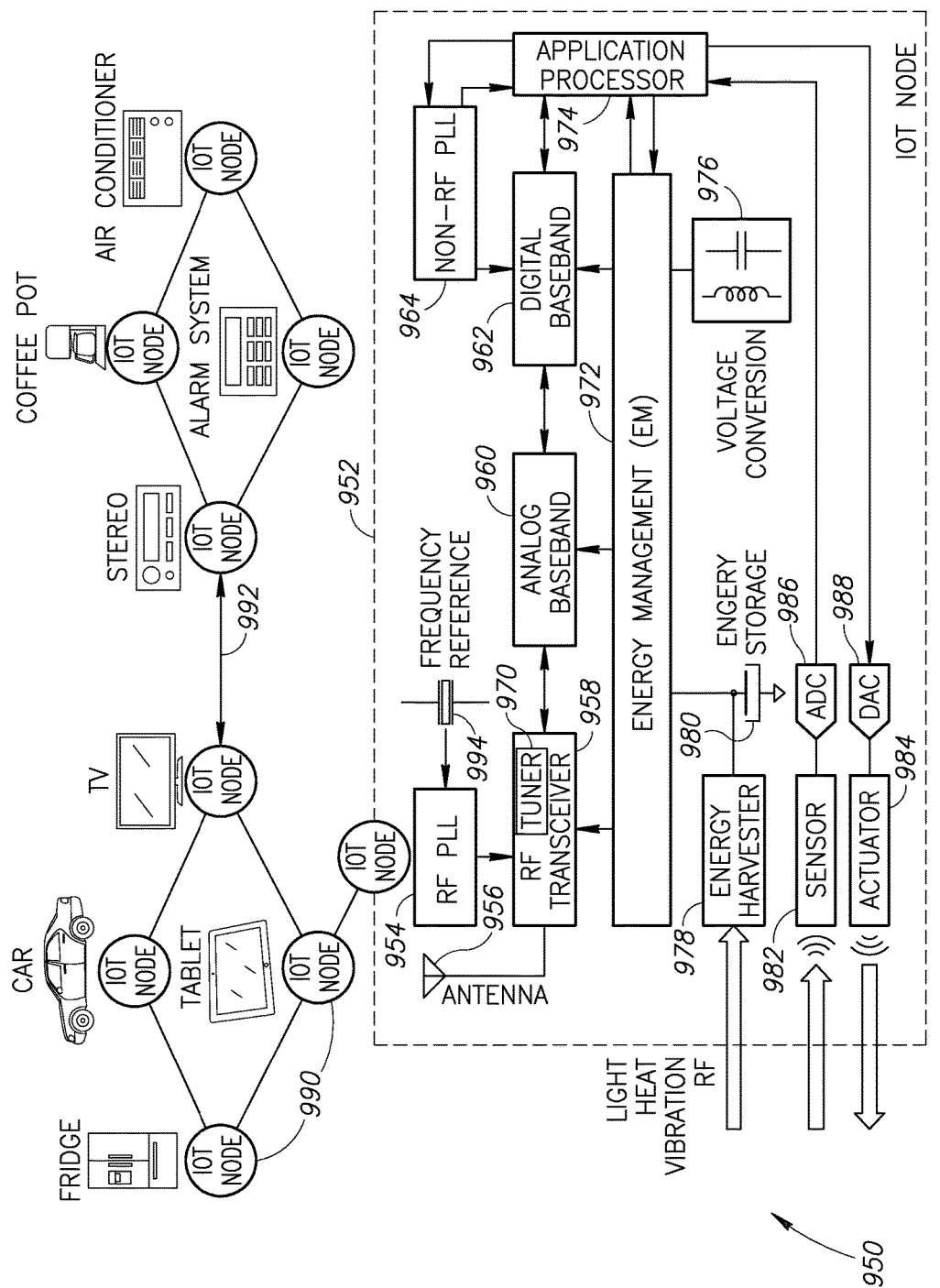
FIG. 12 is a block diagram illustrating an example IoT node incorporating the tuner of the present invention.

A block diagram illustrating an example IoT node incorporating the adaptive antenna tuner of the present invention is shown in FIG. 12. The example IoT, generally referenced 950, comprises a plurality of nodes 990. The architecture of an example IoT node 952 shown can be fully integrated as a System on Chip (SoC) on a single IC chip in nanoscale CMOS. It contains the radio subsystem to wirelessly communicate with other nodes and gateways 992, application processor to impart a certain amount of local "intelligence", sensor and an optional actuator to interface with the environment and energy management to harvest energy (light, heat, vibration or RF power) from the environment and/or convert the voltage levels to those required by the functional circuitry. The RF and non-RF frequency synthesizers provide local oscillator and processor clocks, respectively. A frequency reference 994 provides a fixed clock with excellent long term stability to the frequency synthesizers. In one embodiment, the tuner of the present invention described supra is incorporated in the RF transceiver 958 as circuit block 970.

The RF transceiver 958 interfaces with an antenna 956. The RF signals on the order of 100's of MHz up to several GHz are upconverted and downconverted there to the lower (i.e. baseband) frequencies, which are then processed in the analog baseband circuitry. The conversion from analog to digital (i.e. ADC), and vice versa (i.e. DAC), is also performed there. The digital baseband completes the physical layer of a chosen communication standard. The application processor performs various control and signal processing functions and is responsible for giving a level of "intelligence" to the IoT node.

The RF frequency synthesizer 954 is realized as an all-digital PLL (ADPLL) and provides a local oscillator signal to the RF transceiver 958. The non-RF frequency synthesizer 964 provides clocks to the digital baseband 962 and application processors 974. The clock frequency has to be dynamically switchable in response to the changing computational load conditions. The energy management (EM) circuitry 972 provides energy conversion between the energy harvester 978 and/or low-capacity storage battery 980 and all the IoT functional circuits. The EM circuit carries out several functions. First, it boosts the voltage from the energy harvester (e.g., light, heat, vibration, RF electromagnetic, etc.) to that required by the nanoscale CMOS circuits, which is in the range of 0.7 to 1.0 V assuming 40 nm CMOS technology. This is performed by a dedicated DC-DC boost converter 976. Second, it down-shifts the energy from a battery, which is on the order of 1.5 to 3.6 V to that required by the nanoscale CMOS circuits. This is performed by a dedicated DC-DC buck converter 976. Third, both boost and buck converters use energy storage passive devices, i.e. capacitor or inductor for storing electrical and magnetic energy, respectively, in order to change the voltage level with high efficiency. The high conversion efficiency must be maintained across the entire range of the allowed loads. Fourth, the EM needs to provide many power supply domains. This is dictated by the different voltage level requirements during voltage scaling. Fifth, the EM supply domains preferably provide individually adjustable voltage levels. The supply voltage level of digital logic circuits widely vary depending on the fast changing real time computational load conditions, while the voltage level of digital RF and analog circuits experience less of such variance, and mainly due to temperature and operating frequency, as well as communication channel conditions. Moreover, the analog circuits have to be properly biased, which normally prevents them from operating at near-threshold conditions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An adaptive antenna tuner coupled to an antenna matching network, comprising:
   a sensor circuit operative to generate:
      a current sense signal sensed from an input to the antenna matching network;
      a voltage sense signal sensed from the input to the antenna matching network; and
   a tuning control signal circuit operative to generate, in accordance with said current sense signal and said voltage sense signal, control signals for output to the antenna matching network for modifying the impedance thereof to improve impedance matching between an associated antenna and power amplifier coupled thereto;
   wherein first control signals are generated so as to add capacitance and/or inductance to said matching network to minimize a phase difference between said voltage sense signal and said current sense signal, wherein the phase difference represents an imaginary part of the impedance; and
   wherein second control signals are generated, once said phase is minimized, so as to modify capacitance and/or inductance within said matching network to maximize a product of said voltage and said current, thereby moving said impedance to a center of a Smith chart and maximizing power transfer to said antenna.

2. The adaptive antenna tuner according to claim 1, wherein said voltage sense signal is generated utilizing a capacitive divider.

3. The adaptive antenna tuner according to claim 1, wherein said current sense signal is generated based on magnetic coupling with a transmission line connecting a power amplifier to the antenna matching network.

4. The adaptive antenna tuner according to claim 1, wherein said current sense signal and said voltage sense signal are processed to obtain an X-path signal to indicate a sign of an input impedance imaginary part and an R-path signal to indicate whether a magnitude of input power from an associated power amplifier is maximized.

5. The adaptive antenna tuner according to claim 4, wherein said R-signal indicates maximum transmitted power corresponding to an impedance at a center of a corresponding Smith chart representing impedance of the antenna matching network.

6. The adaptive antenna tuner according to claim 4, wherein said X-signal indicates whether a current real part of said voltage sense signal and said current sense signal is closer or further away from a horizontal axis of a corresponding Smith chart representing impedance of the antenna matching network.

7. The adaptive antenna tuner according to claim 1, wherein said first control signal is operative to indicate whether to add capacitance or inductance to a tunable component in the antenna matching network.

8. The adaptive antenna tuner according to claim 1, wherein said second control signal is operative to indicate whether to tune a tunable component in the antenna matching network in a same or opposite direction as a previous tuning step.

9. A method of tuning an adaptive matching network coupled to an antenna matching network, the method comprising:
   receiving sense signals indicating voltage and current input to the antenna matching network and representing a complex input impedance thereof;
   generating an X-path signal indicating a sign of an imaginary part of said complex input impedance;
   generating an R-path signal indicating whether a current real part of said one or more sense signals is closer or further away from a horizontal axis of a corresponding Smith chart representing a complex impedance of the antenna matching network;
   generating, based on said voltage and current sense signals, control signals for modifying the impedance of the antenna matching network in accordance therewith to improve impedance matching between an associated antenna and power amplifier coupled thereto;
   wherein first control signals are generated so as to add capacitance and/or inductance to said matching network to minimize a phase difference between said voltage sense signal and said current sense signal; and
   wherein second control signals are generated, once said phase is minimized, so as to modify capacitance and/or inductance within said matching network to maximize a product of said voltage and said current, thereby moving said impedance to a center of the Smith chart and maximizing power transfer to said antenna.

10. The method according to claim 9, wherein said voltage sense signal is generated utilizing a capacitive divider.

11. The method according to claim 9, wherein said current sense signal is generated based on magnetic coupling with a transmission line connecting a power amplifier to the antenna matching network.

12. The method according to claim 9, wherein said R-path signal indicates whether a magnitude of input power from said associated power amplifier is maximized.

13. The method according to claim 9, wherein said first control signal is operative to indicate whether to add capacitance or inductance to a tunable component in said antenna matching network.

14. The method according to claim 9, wherein said second control signal is operative to indicate whether to tune a tunable component in said antenna matching network in a same or opposite direction as a previous tuning step.

15. An adaptive antenna tuner coupled to an antenna matching network, comprising:
   a sensor circuit operative to generate from one or more sense signals indicating voltage and current input to the antenna matching network and representing a complex input impedance thereof:
      an X-path signal indicating a sign of an imaginary part of said complex input impedance;
      an R-path signal indicating whether a current real part of said one or more sense signals is closer or further away from a horizontal axis of a corresponding Smith chart representing a complex impedance of the antenna matching network;
   a tuning control signal circuit operative to generate, based on said voltage and current sense signals, control signals for output to said antenna matching network for modifying the impedance thereof to improve impedance matching between an associated antenna and power amplifier coupled thereto;
   wherein first control signals are generated so as to add capacitance and/or inductance to said matching network to minimize a phase difference between said voltage and current sense signals, wherein the phase difference represents an imaginary part of the impedance; and
   wherein second control signals are generated, once said phase is minimized, so as to modify capacitance and/or inductance within said matching network to maximize a product of said voltage signal and said current signal, thereby moving said impedance to a center of a Smith chart and maximizing power transfer to said antenna.

16. The adaptive antenna tuner according to claim 15, wherein said second control signal is operative to indicate whether to tune a most sensitive R-tuning component in the antenna matching network in a current R-tuning step in the same or opposite direction of a previous R-tuning step.

17. The adaptive antenna tuner according to claim 15, wherein said voltage sense signal is generated utilizing a capacitive divider.

18. The adaptive antenna tuner according to claim 15, wherein said current sense signal is generated based on magnetic coupling with a transmission line connecting a power amplifier to the antenna matching network.

19. The adaptive antenna tuner according to claim 15, wherein said first control signal is operative to indicate whether to add capacitance or inductance to a most sensitive X-tuning component in the antenna matching network.

20. A method of adaptively tuning an antenna matching network coupled to an antenna, the method comprising:
   generating a current signal and a voltage signal sensed from an output of a power amplifier coupled to said antenna matching network;
   generating one or more control signals for output to the antenna matching network for modifying the impedance thereof in accordance with said current signal and said voltage signal, wherein said one or more control signals are generated so as to:
      add capacitance and/or inductance to said matching network to minimize a phase difference between said voltage signal and said current signal thereby generating a substantially real impedance, wherein the phase difference represents an imaginary part of the impedance; and modify capacitance and/or inductance in said matching network, once said phase is minimized, to move said substantially real impedance to a center of a Smith chart by maximizing a product of said voltage and current, thereby maximizing power transfer to said antenna.

\* \* \* \* \*